United States Patent [19]

Sferrazza et al.

[11] Patent Number: 5,724,370
[45] Date of Patent: Mar. 3, 1998

[54] CRC GENERATION AND DETECTION METHOD

[75] Inventors: Paul K. Sferrazza, Branchbone; Joseph W. Harmon, East Brunswick, both of N.J.

[73] Assignee: Harris Corporation, Melbourne, Fla.

[21] Appl. No.: 395,814

[22] Filed: Feb. 28, 1995

[51] Int. Cl.$^6$ .................................................. H03M 13/00
[52] U.S. Cl. .................................................. 371/53
[58] Field of Search ...................................... 371/53, 37.1

[56] References Cited

U.S. PATENT DOCUMENTS

| | | | |
|---|---|---|---|
| 4,398,298 | 8/1983 | Van Egmond et al. | 375/7 |
| 4,434,421 | 2/1984 | Baker et al. | 340/825.51 |
| 4,573,045 | 2/1986 | Galin | 340/825.5 |
| 4,639,921 | 1/1987 | Gang et al. | 371/53 |

*Primary Examiner*—Stephen M. Baker
*Attorney, Agent, or Firm*—Rogers & Killeen

[57] ABSTRACT

A method of generating a cyclic redundancy check (CRC) word during transmission and of validating a CRC word during reception in a multiplex data communication system using a single CRC register. A CRC word is generated as data are transmitted by calculating the CRC word based on reflected data, rather than on the transmitted data. The transmitted data is reflected back to the transmitting unit's CRC generation block and the CRC word is immediately generated and appended to the outgoing transmission. In an aspect of the invention and to check whether the transmission was error-free, the one's complement of a CRC word is generated and stored in a CRC register, and the reflected transmission of the CRC word is circulated through the CRC register to yield a predetermined constant value if the transmission was error free.

15 Claims, 4 Drawing Sheets

CRC GENERATION AND DETECTION METHOD

BACKGROUND OF THE INVENTION

The present invention relates to generation of cyclic redundancy checks (CRC) for validating accuracy of data transmissions, and more particularly to a method of generating and validating CRC words that uses a single CRC register.

With reference to FIG. 1, a data communication system may include bus 10 for connecting plural nodes 12 to a microprocessor 14. The nodes 12 may include plural microprocessors 14, and the microprocessor 14 may include a circuit 16 for interfacing with the bus. The interface circuit 16 may include control logic 18, timing generator 20, a CRC generator 22, and an encoder/decoder 24 for generating data signals that match system specifications and for decoding signals received from the bus. A separate transceiver 26 may be provided.

Cyclic redundancy checks are used in binary communication systems to detect errors in communicated data. CRC generating methods typically include the computation of a mathematical value related to a block of data, and the inclusion of the mathematical value (CRC word) at the end of transmission of the block of data. Upon receipt of the block of data and CRC word, a new mathematical value related to the block of data is computed using the same computation scheme, and the newly computed CRC word is compared to the received CRC word; if they are the same the transmission was error-free.

The computation of the mathematical value of a CRC word of a size less than $2^N$ (i.e., N bits when represented as a binary number) typically involves using arithmetic to multiply the entire numeric binary value of a block of data by $2^N$ and subsequently to divide it by a constant of a value greater than $2^N$ and less than $2^{N+1}$ called a generator polynomial. The quotient is discarded, and the one's complement of the remainder of a value less than $2^N$ (the CRC word) is appended to the original numeric binary value and is transmitted therewith. CRC words may be computed using a multiple section feedback shift register with exclusive-OR logic elements between sections to perform the modulo-2 arithmetic calculations. Each bit (or each byte) may be provided to the CRC register where it is "circulated" through the CRC computational algorithm (circulation referring to the movement of data through the CRC register). CRC computational algorithms may be implemented in hardware or software, and need not be discussed in further detail for an understanding of the present invention.

In a multiplex data communication system, a CRC register is typically used to compute the CRC word which is to be appended to a transmitted block of data. All receiving nodes and the transmitting node validate the accuracy of a received block of data by passing the block of data through a CRC register identical to that used to compute the CRC word. As will be appreciated, this requires the use of two CRC registers, or a means for selecting between transmitted and received data as the input to a single CRC register. While the desirability of reducing the number of CRC registers is apparent, the practical problems associated with the use of a single register to compute and store a first CRC word when transmitting and simultaneously compute and verify a second CRC word have not been overcome heretofore.

Accordingly, it is an object of the present invention to provide a novel method of generating and detecting a CRC word that obviates the problems of the prior art.

It is another object of the present invention to provide a novel method of generating a CRC word that uses a single shift register to generate a CRC word for both transmission and reception of data without having to select a shift register input from either the transmitted or the received data.

It is still another object of the present invention to provide a novel method of generating a CRC word in which the data are transmitted and during the tranmission of which and the CRC word is compiled based on the received reflection of the transmitted data, and in which the compiled CRC word is appended to the data by immediately transmitting the CRC word at the end of the data.

It is yet another object of the present invention to provide a novel method of generating and validating a CRC word in which the one's complement of a CRC word is generated and stored in the CRC register, and in which the data in the reflected transmission is circulated through the CRC register to yield a predetermined constant value if the transmission was error free.

It is also another object of the present invention to provide a novel method of generating and verifying a CRC in which a one's complement of a CRC word is generated in a CRC register that is thereafter configured as a simple shift register so that the contents of the register may be shifted through the register for transmission, and in which the shift register is reconfigured to a CRC register after transmission (but not re-initialized) so that the CRC word in the reflected transmission may be circulated through the CRC register to yield a predetermined constant value if the transmission was error free.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
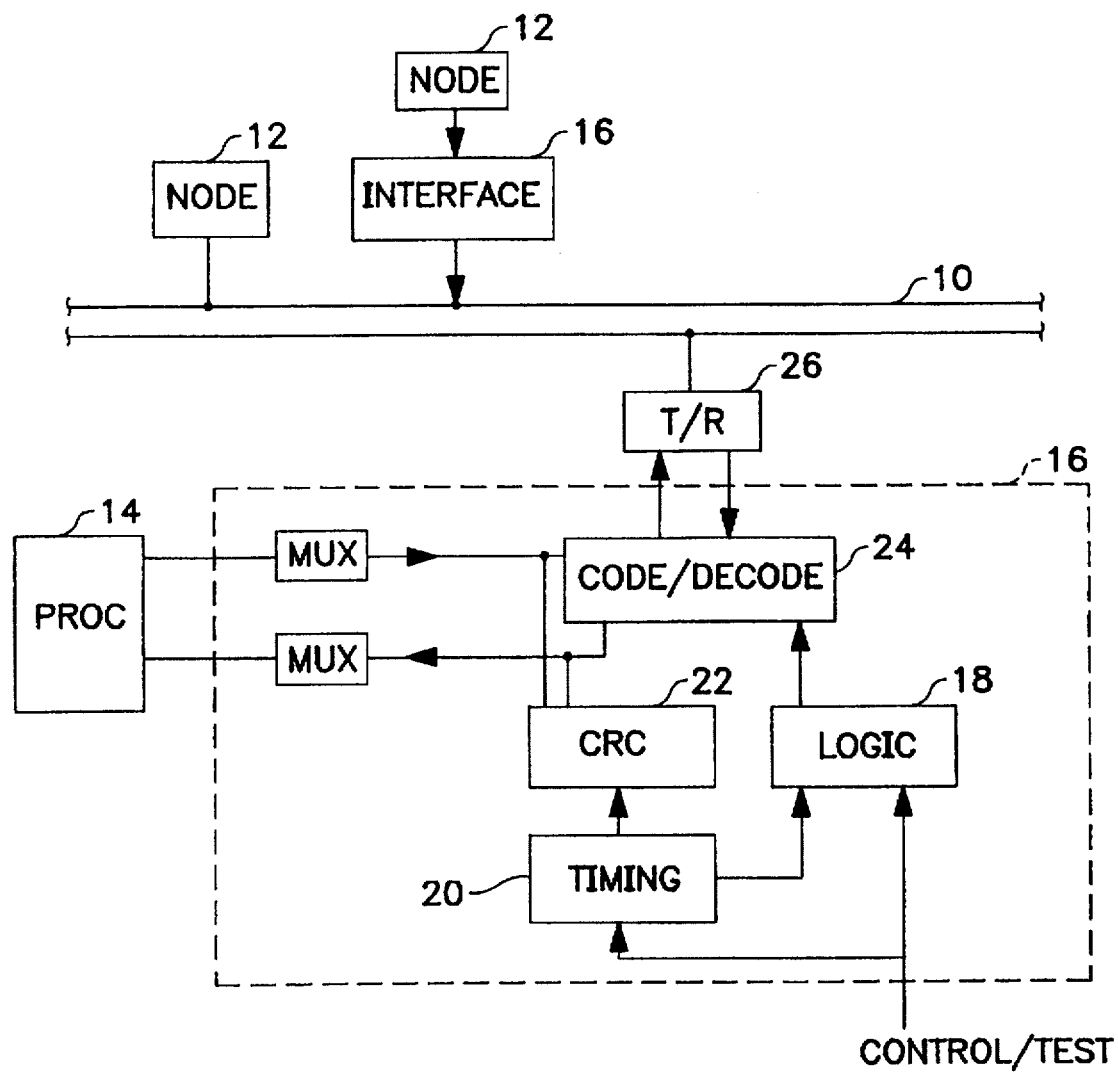
FIG. 1 is a block diagram of a bus interface system of the prior art in which the present invention may find application.
Figure 5:
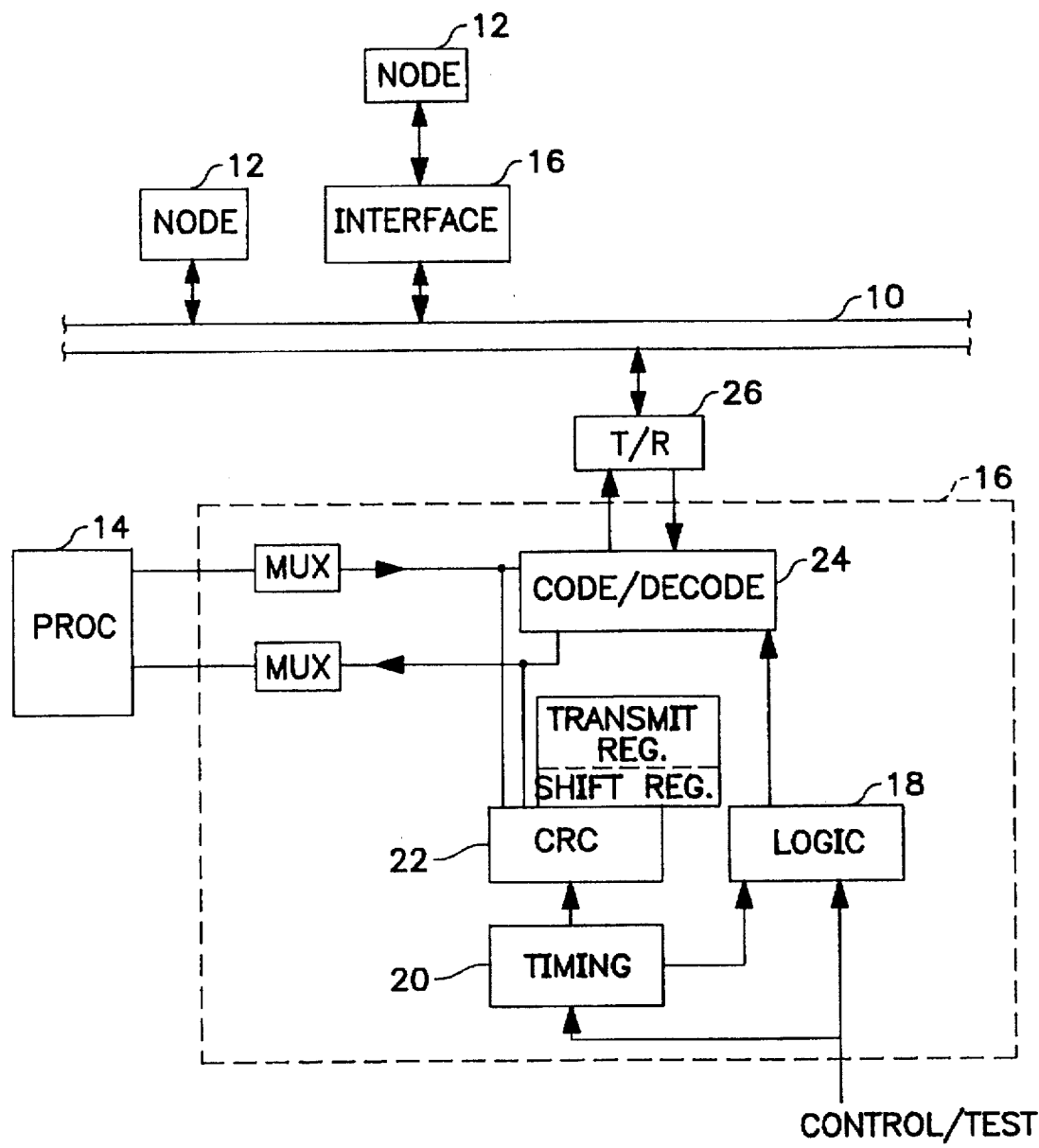
FIG. 5 is a schematic block diagram illustrating circuitry in a bus interface system in which the present invention may find application.

The methods of the present invention may be practiced utilizing the circuitry illustrated by schematic block diagram in FIG. 5, wherein the numeric representations of FIG. 5 correspond to those of FIG. 1.

Figure 2:
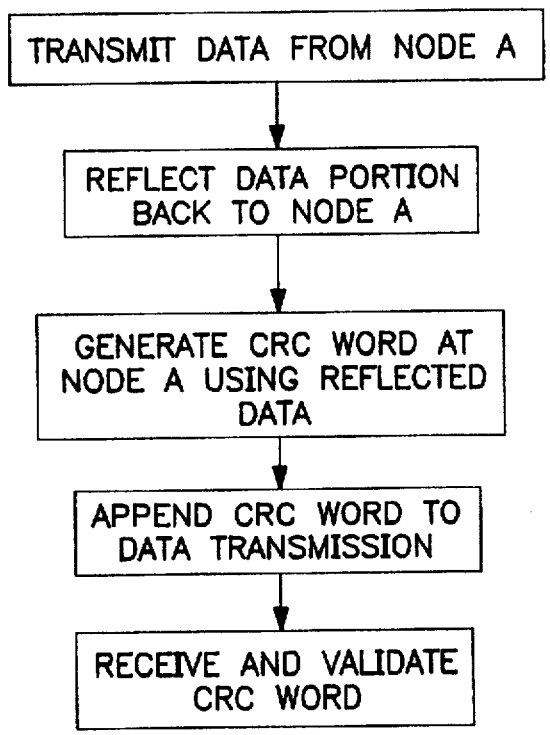
FIG. 2 shows the general process of using reflected data for CRC generation as performed by an embodiment of the present invention.

In an embodiment of the method of the present invention a CRC word may be generated and validated in a multiplex data communication system by compiling a CRC word in a CRC register based on the reflected data at a transmitting station in the data communication system. That is, the CRC word may be derived from the reflection of the transmitted data rather than the transmitted data. A block of data may be transmitted, during the transmission of which the reflection of that data may be provided to a CRC register where a CRC may be compiled and appended to the transmitted data. Other stations receiving the block of data will receive the appended CRC word and may process the data and CRC word conventionally. Thus, the CRC block uses a single CRC register, rather than two, since the CRC block acts on received data, whether the data are reflected from the transmitting node so that the CRC word may be appended, or from another node. This process is shown in FIG. 2. Further, computing the CRC based on the reflected data as opposed to the transmitted data channel allows the CRC circuitry to work the same way during transmission and reception of data, without using special circuitry to switch the input of the CRC register.

This method may be particularly applicable in multiplex data communication systems which use a bit-by-bit, non-destructive arbitration process. In such systems, each node makes a bit-by-bit comparison between a transmitted signal and a received signal in the arbitration process. When two or more nodes are transmitting simultaneously on the bus, the signals from one of the nodes will override the other. Thus, one of the nodes will sense (via the bit-by-bit arbitration process) that the signal being received is not the same as the one it sent. The arbitration process indicates to the losing node that it is to cease transmitting, but that it is to continue to receive data and to continue to compute a CRC word based on the data received. By way of example, a data communication system that provides bit-by-bit, non-destructive arbitration may provide that a high signal (a one) has priority over a low signal (a zero), and that a data transmission cannot be started if a transmitting station sees that a high signal is present. If two nodes are transmitting simultaneously, and if one of the nodes that has transmitted a zero receives a one instead of a zero, the node would know that it has lost priority on the system, and would cease transmitting while continuing to receive data from the other node that is transmitting the signal with the higher priority.

Figure 3:
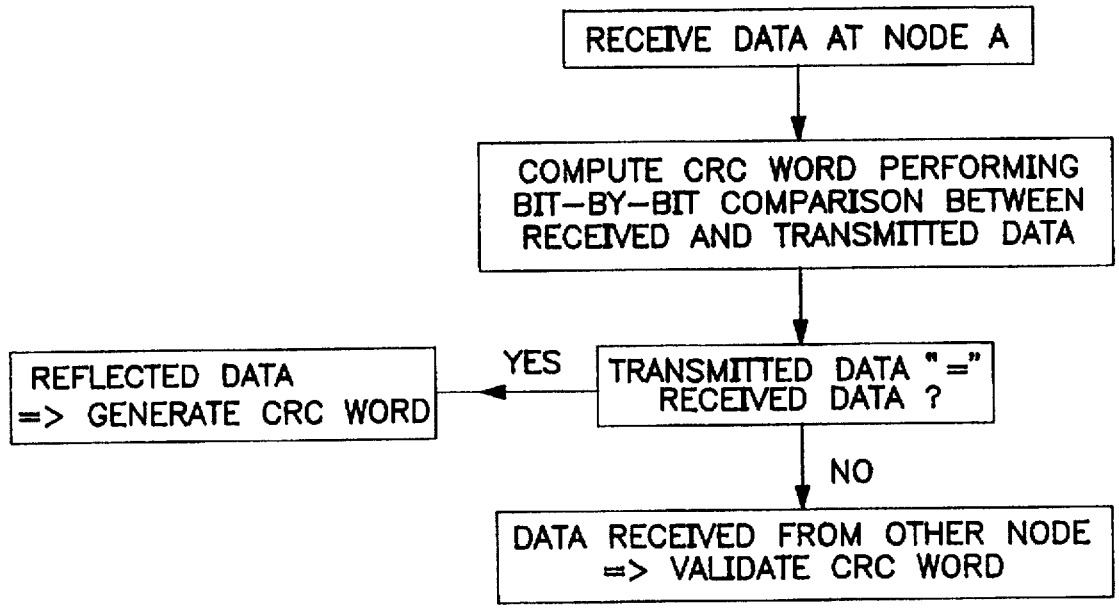
FIG. 3 shows an algorithm used in various embodiments to determine which CRC function the CRC register is currently performing.

With reference now to FIG. 3, as the present invention is applied to this type of system, a first node receiving a signal will generate a CRC word from the received data regardless of whether the first node wins or loses arbitration. If the first node loses arbitration (meaning the signal was transmitted from a second node), the CRC word generated by the first node may be used conventionally to validate the accuracy of the transmission from the second node. If the first node wins arbitration (meaning the signal was sent from the first node), the CRC word generated by the first node may be appended to its transmission as discussed above.

Figure 4:
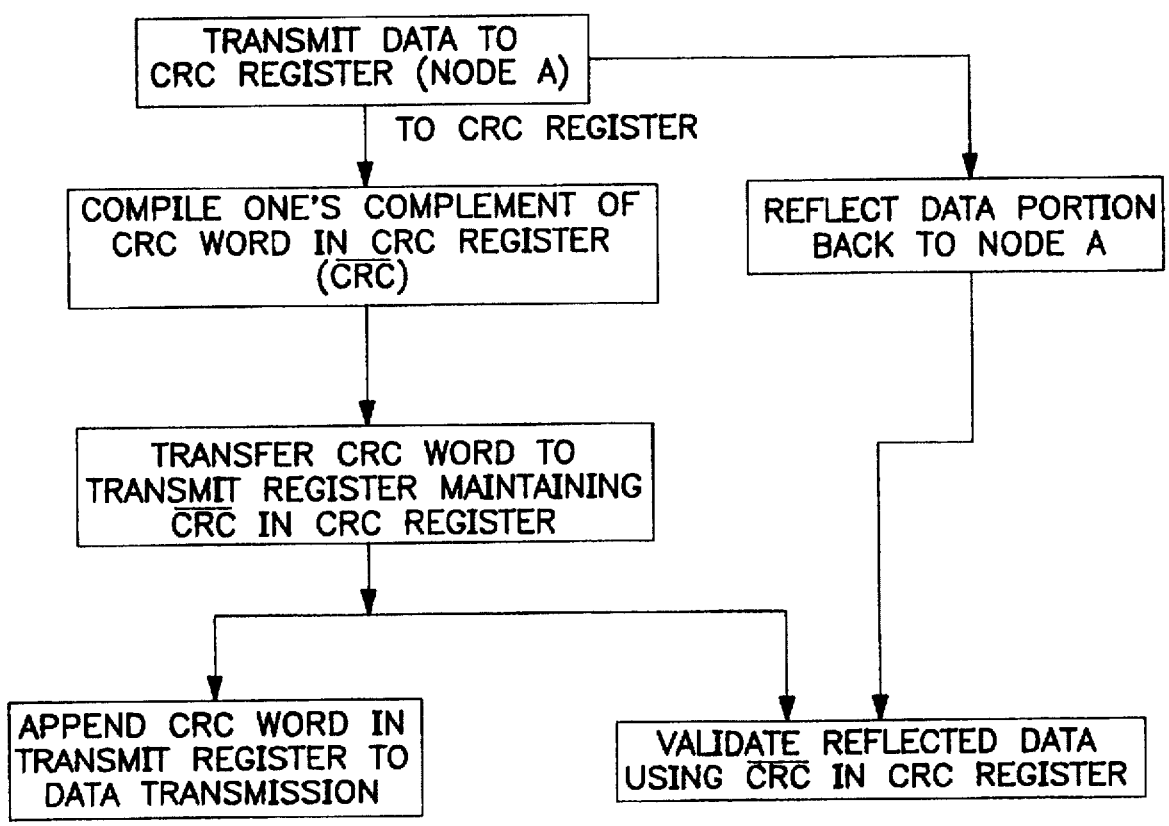
FIG. 4 shows the process of CRC word validation at the transmitting node as performed by an embodiment of the present invention.

In a further embodiment of the present invention, the CRC word may also be validated at the transmitting node as indicated in FIG. 4. A one's complement of a CRC word may be compiled in a CRC register as the data are being transmitted. The CRC register may thereafter be reconfigured as a simple shift register with the last stage output connected to the first stage input by disabling the exclusive-OR feedback elements between stages. The reconfigured CRC register may then be shifted a number of times equal to the number of stages so that the pre-shift contents of the CRC register is restored. While the one's complement in the CRC register is shifting, the content of the CRC register is being output complemented, and transferred to a transmit register for later transmission at the end of the data. The CRC register may then be reconfigured by reconnecting the exclusive-OR feedback elements between stages, without re-initializing the CRC register. Thereafter, the block of data in the reflected transmission may continue to be circulated through the CRC register, as discussed above. Because the CRC register has the one's complement therein, when the remaining data in the reflected transmission (i.e., the CRC word) is circulated through the register, the output of the register will be a predetermined constant value if the transmission was error free.

By way of further explanation, at the end of the data transmission, after the one's complement of the CRC word has been compiled, in the CRC register but before the first CRC bit is transmitted, the contents of the CRC register may be complemented and transferred to the data transmit register to be appended to the data block later. In the case of a serial transmit register, the CRC register may be disabled so that it is, in effect, a standard shift register and no longer functions as a CRC register. For example, the CRC register may be disabled by disconnecting (or otherwise disabling) the feedback mechanisms between the stages in the CRC register so that the CRC register is not able to circulate the data through the mathematical algorithm. The output of the final stage may provide the input to the first stage of the CRC register and, because the CRC register is disabled, the contents are merely stored therein without change when the register is shifted because the data is not "modified" by the disabled feedback mechanism. At this time the transmit register contains the CRC word and normal operation of the CRC register may be restored by re-enabling the feedbacks between stages shifting.

The transmitted block of data may then be reflected from the bus back to the CRC register at the transmitter to evaluate whether there were errors in the transmission. This time the CRC register is not re-initialized and the previously stored one's complement of the CRC word is left in the CRC register. The received block of data is provided to the CRC register and again circulated through the mathematical algorithm. However, because the one's complement of the CRC word was already in the CRC register, the result of the compilation will be different; if the data transmission was error-free the result of the compilation will be a constant value K that may be predetermined. The result of the compilation may be compared to the predetermined value K; if it matches the data transmission was error-free, and if it does not an error may be indicated.

The value K will relate to the generating polynomial used in the CRC compilation. K is the constant which results from initializing the contents of the CRC register to any arbitrary value and then circulating the one's complement of that value through the CRC register. If the same or an identical CRC register is initialized to a predetermined initialization constant, generally the complement of 0 (i.e., all bits set to 1) and a block of data is then circulated through the CRC register, the contents of the CRC register will be defined as the complement of the CRC word. The CRC word will be a function of the block of data transmitted and the initialization constant chosen. The contents of the CRC register may be output, complemented, and stored in the transmit register from which it is appended to the block of data as initially discussed above. Circulation of the reflected CRC word in the CRC register will then result in the constant K being held within the CRC register.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of generating a cyclic redundancy check (CRC) word in a data communication system in which a block of a data transmission is transmitted from a transmitter onto a bus and the transmitted block of data is reflected back to the transmitter, the method comprising the steps of:

(a) transmitting from a transmitter a block of a data transmission onto the bus;

(b) reflecting the block of data back to the transmitter;

(c) cycling the reflected block of data through a CRC register at the transmitter; and (d) appending a CRC word to the data transmission by transmitting the CRC word from the transmitter after receipt of the block of data.

2. The method of claim 1 further comprising the step of compiling the CRC word in the CRC register when the reflected block of data is cycled through the CRC register.

3. The method of claim 2 wherein the CRC word transmitted in step (d) is provided from the CRC register.

4. The method of claim 1 wherein step (a) includes the step of compiling in the CRC register a one's complement of the CRC word for the block of data.

5. The method of claim 4 further comprising, after step (a), the steps of reconfiguring the CRC register to a shift register by disabling CRC feedback mechanisms in the CRC register, shifting the disabled CRC register a number of shifts equal to a number of stages in the CRC register while storing a complement of the contents of the CRC register in a transmit register at the transmitter, whereby the CRC register holds the one's complement of the CRC word and the transmit register holds the CRC word.

6. The method of claim 5 further comprising the step of re-enabling the CRC register before the reflected block of data is cycled therethrough in step (c).

7. The method of claim 5 further comprising, after step (c), the step of comparing the contents of the CRC register to a predetermined value to determine whether the transmission of the block of data was error free.

8. The method of claim 5 wherein the CRC word transmitted in step (d) is provided from the transmit register.

9. A method of generating a CRC word in a data communication system in which data are transmitted from a transmitter onto a bus and the transmitted data are reflected back to the transmitter, comprising the steps of cycling the reflected data through a CRC register at the transmitter to generate a CRC word, and appending the CRC word to the data by transmitting the CRC word from the transmitter after receipt of the data.

10. A method of generating and validating a cyclic redundancy check (CRC) word in a data communication system in which a block of data is transmitted from a transmitter onto a bus and the transmitted block of data is repeated back to the transmitter for verification, the method comprising the steps of:

(a) compiling a one's complement of a CRC word in a CRC register by cycling a transmitted block of data through the CRC register, the one's complement being stored in the CRC register;

(b) receiving the transmitted block of data and cycling the received block of data through the CRC register; and (c) comparing the contents of the CRC register to a predetermined value to determine whether the block of data was transmitted without error, wherein the absence of errors is indicated when the CRC register holds the predetermined value.

11. The method of claim 10 wherein the block of data is cycled through the CRC register in step (b) without re-initializing the CRC register.

12. The method of claim 10 wherein the predetermined value is related to a generating polynomial used in compiling the one's complement of the CRC word.

13. The method of claim 10 further comprising the steps of:

disabling the CRC register's ability to compile a CRC word after compiling the one's complement of the CRC word;

shifting the CRC register to provide the CRC word to a transmit register at the transmitter;

restoring the CRC register's ability to compile a CRC word before the reflected block of data is cycled through the CRC register; and transmitting the CRC word from the transmit register after the block of data has been received.

14. The method of claim 13 wherein the CRC register is disabled by disabling feedback mechanisms between stages in the CRC register.

15. A method of CRC validation for a data transmission comprising the steps of compiling a one's complement of a CRC word in a CRC register that is thereafter prevented from compiling a CRC word, shifting the CRC register to provide the CRC word to a transmit register, re-enabling the CRC register after data are transmitted, and circulating a reflection of the transmission through the CRC register to yield a predetermined value if the transmission was error free.

* * * * *